(12) United States Patent
Tamemoto

(10) Patent No.: US 8,728,916 B2
(45) Date of Patent: May 20, 2014

(54) METHOD FOR MANUFACTURING SEMICONDUCTOR ELEMENT

(75) Inventor: Hiroaki Tamemoto, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/202,027

(22) PCT Filed: Feb. 4, 2010

(86) PCT No.: PCT/JP2010/051557
§ 371 (c)(1),
(2), (4) Date: Aug. 17, 2011

(87) PCT Pub. No.: WO2010/098186
PCT Pub. Date: Sep. 2, 2010

(65) Prior Publication Data
US 2011/0298084 A1    Dec. 8, 2011

(30) Foreign Application Priority Data

Feb. 25, 2009    (JP) ................................. 2009-041966

(51) Int. Cl.
*H01L 21/00*    (2006.01)

(52) U.S. Cl.
USPC ........... 438/463; 438/113; 438/460; 438/462; 257/E21.237; 257/E21.238

(58) Field of Classification Search
USPC .................. 438/113, 463; 257/620, E21.237, 257/E21.238, E21.214, E23.179; 219/121.67, 121.68
See application file for complete search history.

(56) References Cited

U.S. PATENT DOCUMENTS

| 5,656,186 | A | 8/1997 | Mourou et al. |
|---|---|---|---|
| 2004/0002199 | A1 | 1/2004 | Fukuyo et al. |
| 2005/0173387 | A1 | 8/2005 | Fukuyo et al. |
| 2005/0181581 | A1 | 8/2005 | Fukuyo et al. |
| 2005/0184037 | A1 | 8/2005 | Fukuyo et al. |
| 2005/0189330 | A1 | 9/2005 | Fukuyo et al. |
| 2005/0194364 | A1 | 9/2005 | Fukuyo et al. |
| 2005/0199592 | A1* | 9/2005 | Iri et al. ..................... 219/121.6 |
| 2005/0202596 | A1 | 9/2005 | Fukuyo et al. |
| 2005/0272223 | A1 | 12/2005 | Fujii et al. |
| 2006/0011593 | A1 | 1/2006 | Fukuyo et al. |
| 2006/0040473 | A1 | 2/2006 | Fukuyo et al. |
| 2006/0121697 | A1 | 6/2006 | Fujii et al. |
| 2006/0148212 | A1 | 7/2006 | Fukuyo et al. |
| 2006/0160331 | A1 | 7/2006 | Fukuyo et al. |
| 2007/0158314 | A1 | 7/2007 | Fukumitsu et al. |
| 2007/0298529 | A1* | 12/2007 | Maeda et al. ................... 438/33 |

(Continued)

FOREIGN PATENT DOCUMENTS

| CN | 1938828 A | 3/2007 |
|---|---|---|
| CN | 1983557 A | 6/2007 |

(Continued)

*Primary Examiner* — Benjamin Sandvik
*Assistant Examiner* — Leslie Pilar Cruz
(74) *Attorney, Agent, or Firm* — Global IP Counselors, LLP

(57) ABSTRACT

A method for manufacturing a semiconductor element of the present invention, has: a laser irradiation step of focusing a pulsed laser beam inside of a substrate constituting a wafer, thereby forming a plurality of isolated processed portions along an intended dividing line inside of the substrate, and creating a fissure that runs from the processed portions at least to the surface of the substrate and links adjacent processed portions; and a wafer division step of dividing the wafer along the intended dividing line.

17 Claims, 7 Drawing Sheets

(56) References Cited

U.S. PATENT DOCUMENTS

| | | |
|---|---|---|
| 2008/0003708 A1 | 1/2008 | Hoshino et al. |
| 2008/0035611 A1* | 2/2008 | Kuno et al. .................. 219/69.1 |
| 2008/0090382 A1 | 4/2008 | Fujii et al. |
| 2009/0166808 A1 | 7/2009 | Sakamoto et al. |
| 2010/0203707 A1 | 8/2010 | Fujii et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2013/0009284 A1 | 1/2013 | Fujii et al. |
| 2013/0012000 A1 | 1/2013 | Fujii et al. |
| 2013/0015167 A1 | 1/2013 | Fujii et al. |

FOREIGN PATENT DOCUMENTS

| | | |
|---|---|---|
| JP | 2002-192368 A | 7/2002 |
| JP | 2002-192369 A | 7/2002 |
| JP | 2003-338652 A | 11/2003 |
| JP | 2006-294674 A | 10/2006 |
| JP | 2007-324326 A | 12/2007 |
| JP | 2008-6492 A | 1/2008 |
| JP | 2008-98465 A | 4/2008 |

\* cited by examiner

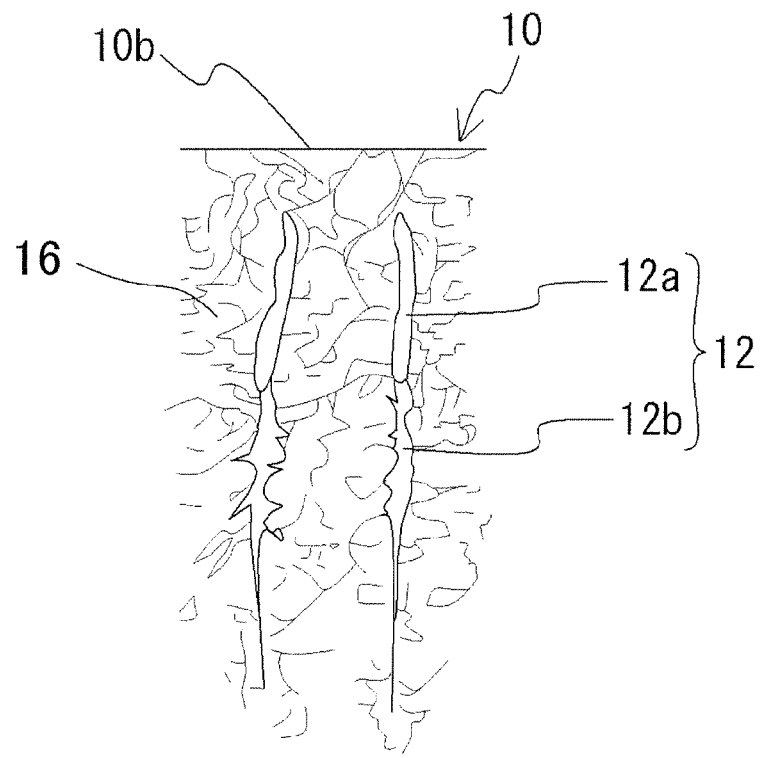
F I G. 7
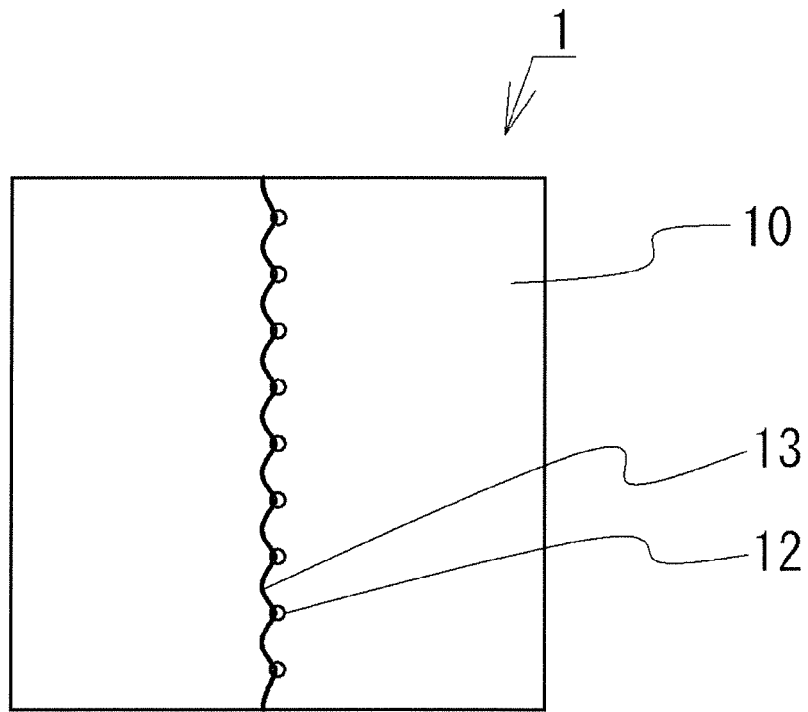
F I G. 8

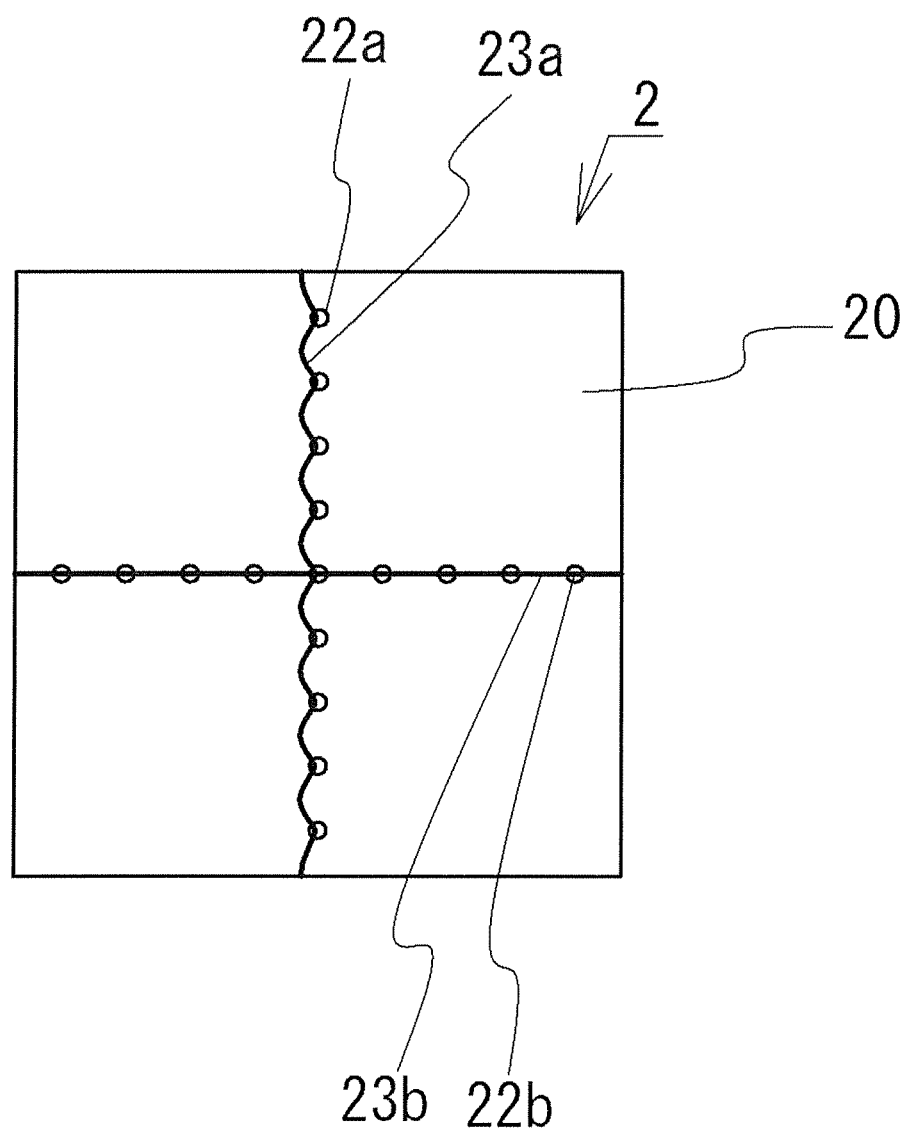
F I G. 9

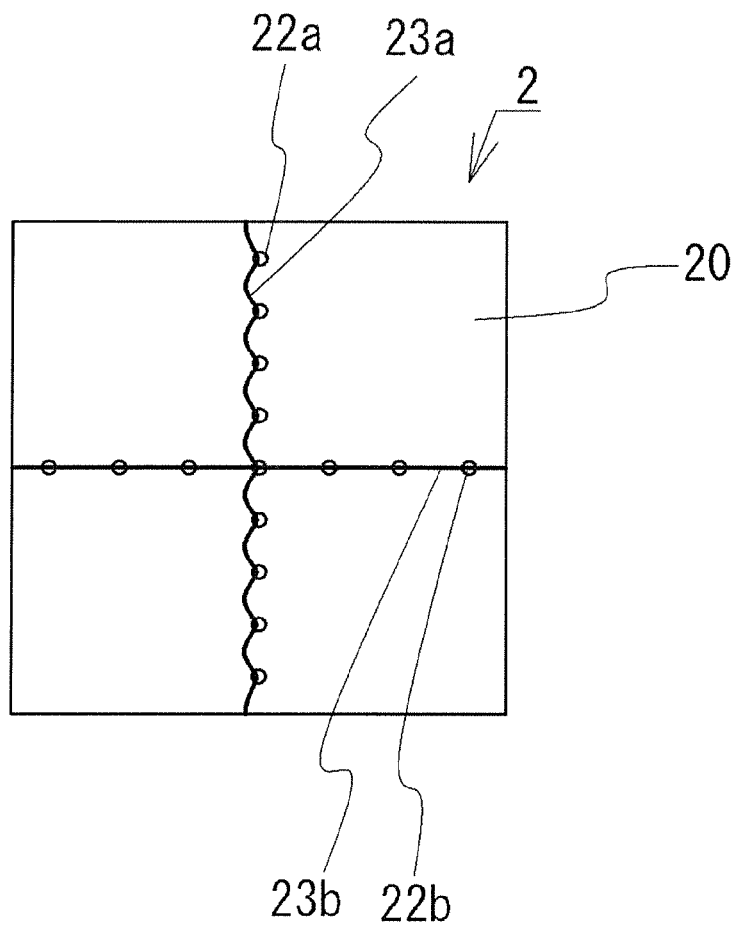
F I G. 10
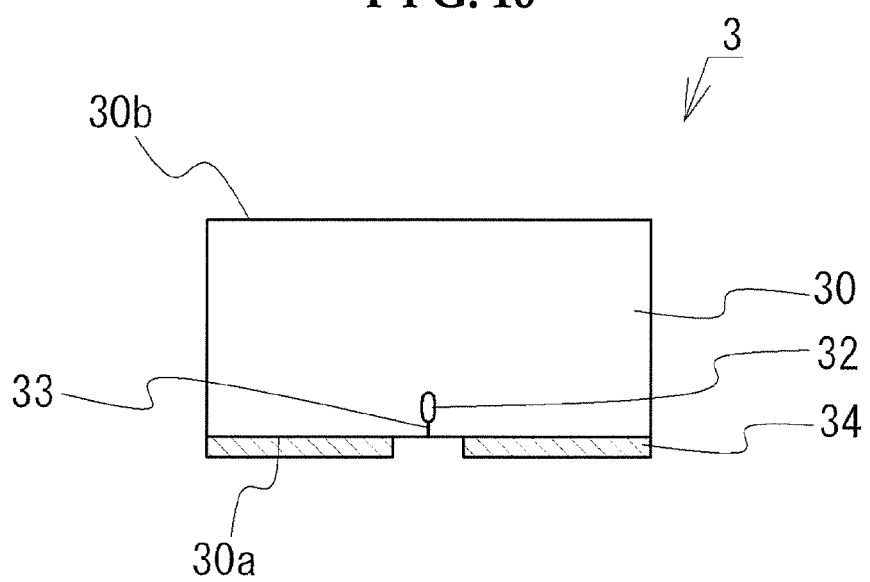
F I G. 11

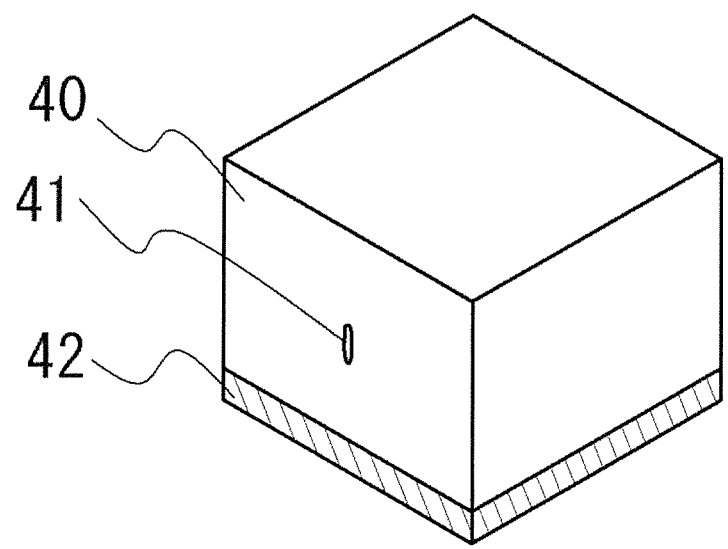
F I G. 12
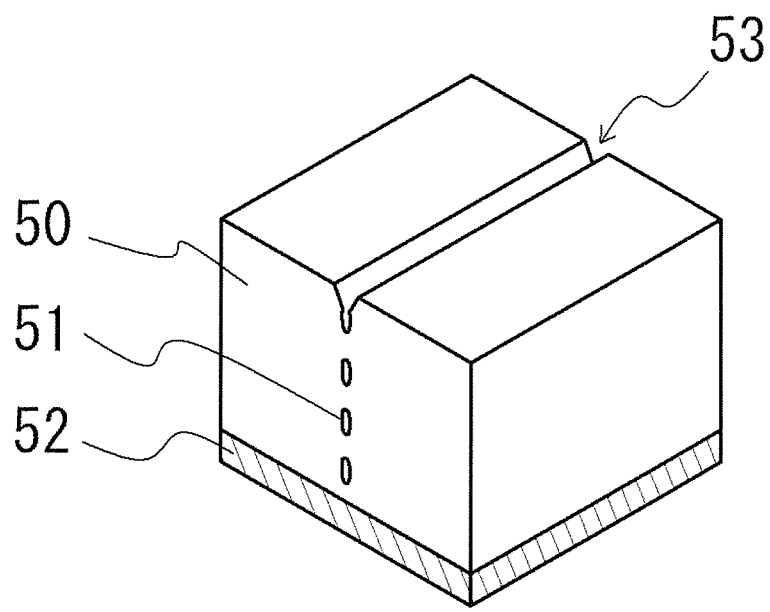
F I G. 13

METHOD FOR MANUFACTURING SEMICONDUCTOR ELEMENT

CROSS-REFERENCE TO RELATED APPLICATIONS

This national phase application claims priority to Japanese Patent Application No. 2009-041966 filed on Feb. 25, 2009. The entire disclosure of Japanese Patent Application No. 2009-041966 is hereby incorporated herein by reference.

TECHNICAL FIELD

The present invention relates to a method for manufacturing a semiconductor element, and more particularly relates to a semiconductor element manufacturing method comprising a step of dividing a wafer that includes a substrate.

BACKGROUND ART

The manufacture of a semiconductor element includes a step of dividing a wafer into element chips, and a method in which separation grooves are formed with a cutter, dicer, or the like and the pieces snapped apart has been used to divide these element chips. A method has been proposed in recent years in which a laser beam is used instead of a cutter or dicer to form separation grooves or the like, and the chips are then broken apart, but with a method in which a wafer is heated and melted by being irradiated with a laser beam, the places that are melted and then re-solidify become discolored, and this decreases the brightness of a light emitting element, so a method has been proposed in which a pulsed laser beam with a short pulse width is used to work the wafer. Using a pulsed laser beam with a short pulse width allows working to be performed that is free of discoloration because it involves multiphoton absorption rather than melting, so there is less of a decrease in the brightness of a light emitting element.

As shown in FIG. 12, a method that has been proposed for dividing element chips using a pulsed laser beam with a short pulse width, in which a modification region 41 is formed by laser irradiation in a region corresponding to an intended dividing line inside of a substrate 40 provided with a semiconductor layer 42, and the chips are broken along this line (JP-2008-6492-A).

Also, as shown in FIG. 13, another method has been proposed in which a plurality of levels of modified components 51 are formed by laser irradiation inside of a substrate 50 provided with a semiconductor layer 52, and a continuous groove 53 is formed by laser irradiation in the surface of the substrate 50, so that the semiconductor light emitting elements are separated from a separation plane along the groove 53 and the plurality of levels of modified components 51 (JP-2008-98465-A and JP-2007-324326-A).

SUMMARY

However, with a method in which a wafer is divided by forming a modification region with a pulsed laser beam only inside of a substrate, the application of external force creates a crack from the modification region inside toward the front and rear faces of the substrate, and this is used to break the wafer, so it is difficult to control the direction in which the crack runs, and the wafer is sometimes divided somewhere other than in the intended division region.

Also, with a method in which grooves are formed by laser irradiation in a substrate surface, the means for forming the separation grooves, which in the past were formed by cutter or dicer, is changed to a laser, making it difficult to control the direction in which the cracks run, just as when chips are split apart along separation grooves made with a cutter or dicer. Furthermore, when a laser beam is focused on the substrate surface to form a groove, the laser beam may sometimes be focused on the outside of the substrate due to problems with the focusing precision of the laser apparatus or to irregularity of the substrate surface. If the focal point is in the air outside the substrate, a plasma will be generated to a corresponding degree, and this wastes some of the energy of the laser beam.

As a result of diligent research to solve the above problems, the inventors have discovered that the above problem can be solved by creating processed portions, and a fissure that links adjacent processed portions and runs from the processed portions to the substrate surface.

A method for manufacturing a semiconductor element of the present invention has: a laser irradiation step of focusing a pulsed laser beam inside of a substrate constituting a wafer, thereby forming a plurality of isolated processed portions along an intended dividing line inside of the substrate, and creating a fissure that runs from the processed portions at least to the surface of the substrate and links adjacent processed portions; and a wafer division step of dividing the wafer along the intended dividing line.

The following requirements can be combined to the method for manufacturing a semiconductor element of the present invention.

The fissure links adjacent processed portions inside of the substrate.

The processed portions have a top part and a bottom part, and the fissure links the top parts and bottom parts of adjacent processed portions.

The distance between the focal position of a pulsed laser beam and the surface of the substrate is at least half a working spot diameter of the pulsed laser beam, and no more than 25 µm.

The distance between the focal position of the pulsed laser beam and the surface of the substrate is at least 5 µm and no more than 25 µm.

The distance between processed portions is at least the working spot diameter of the pulsed laser beam.

The processed portions and the fissures are formed within a range of at least 10% and no more than 80% of the thickness of the substrate.

The intended dividing line is a first intended dividing line, and the fissure is a first fissure, the laser irradiation step further involves focusing the pulsed laser beam inside of the substrate along a second intended dividing line that is substantially perpendicular to the first intended dividing line, thereby forming a plurality of isolated processed portions along an intended dividing line inside of the substrate, and creating a second fissure that runs from the processed portions at least to the surface of the substrate and links adjacent processed portions, and the wafer division step further involves dividing the wafer along the second intended dividing line.

The first fissure goes roundaboutly adjacent processed portions, and the second fissure runs along the second intended dividing line.

The spacing of the processed portions formed along the first intended dividing line is less than the spacing of the processed portions formed along the second intended dividing line.

The substrate has a first main face and a second main face, a semiconductor layer is provided on the first main face, and the pulsed laser beam is emitted from the second main face side in the laser irradiation step.

The distance between the focal position of the pulsed laser beam and the semiconductor layer is greater than 30 μm.

The processed portions are produced by multiphoton absorption.

The substrate is a sapphire substrate.

The second main face is a plane different from the A plane, and the first intended dividing line is a line that intersects the axis of the substrate.

With laser irradiation, processed portions and a fissure that links adjacent processed portions and runs from the processed portions to the substrate surface are created, which makes possible accurate splitting along the processed portions or fissures. When the laser is directed along the intended dividing line, first the fissure extends along the intended dividing line from the processed portions to the substrate surface, and furthermore, cracks extending from the processed portions or the fissure can run along the intended dividing line to the back side of the substrate. This allows the wafer to be divided accurately.

BRIEF DESCRIPTION OF THE DRAWINGS

FIG. 7 is a schematic diagram describing part of the side face of the light emitting device of an embodiment.

FIG. 8 is simplified plan view illustrating a step in this embodiment.

FIG. 9 is simplified plan view illustrating a step in this embodiment.

FIG. 10 is simplified plan view illustrating a step in this embodiment.

FIG. 11 is simplified sectional view illustrating a step in this embodiment.

FIG. 12 is a diagrammatic perspective view describing a conventional manufacturing method.

FIG. 13 is a diagrammatic perspective view describing a conventional manufacturing method.

DETAILED DESCRIPTION OF THE PREFERRED EMBODIMENTS

The method for manufacturing a semiconductor element in this embodiment comprises a laser irradiation step of directing a laser along an intended dividing line, and a wafer division step of dividing the wafer along the intended dividing line. In the laser irradiation step, a plurality of processed portions are formed inside of the substrate by irradiation with a pulsed laser beam, and a fissure is generated that runs from the processed portions at least to the surface of the substrate and links adjacent processed portions.

An embodiment of the method of the present invention will now be described in detail through reference to the drawings. The drawings are schematic representations, and some parts may be exaggerated beyond what they actually are. Also, the present invention is not limited to or by the following embodiments or Examples, and various modifications are possible without departing from the technological concept of the present invention.

Laser Irradiation Step

Figure 1:
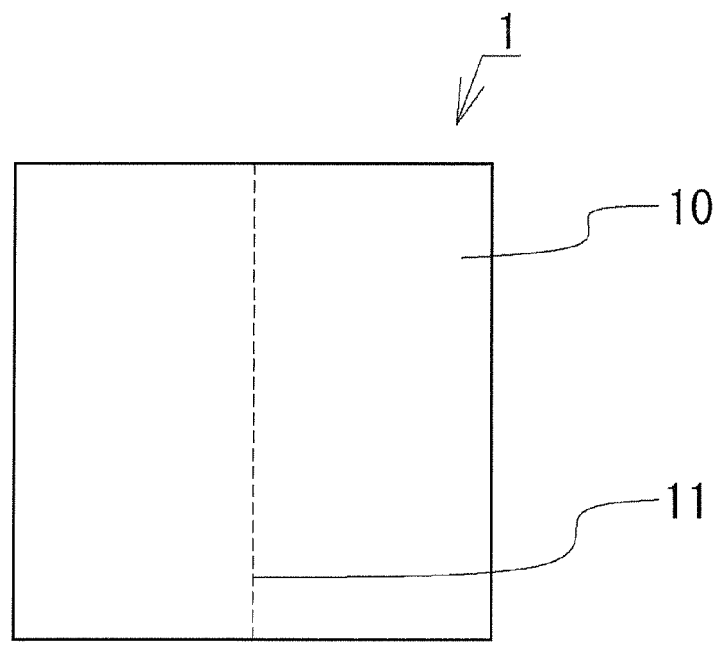
FIG. 1 is simplified plan view illustrating the main steps in this embodiment.
Figure 2:
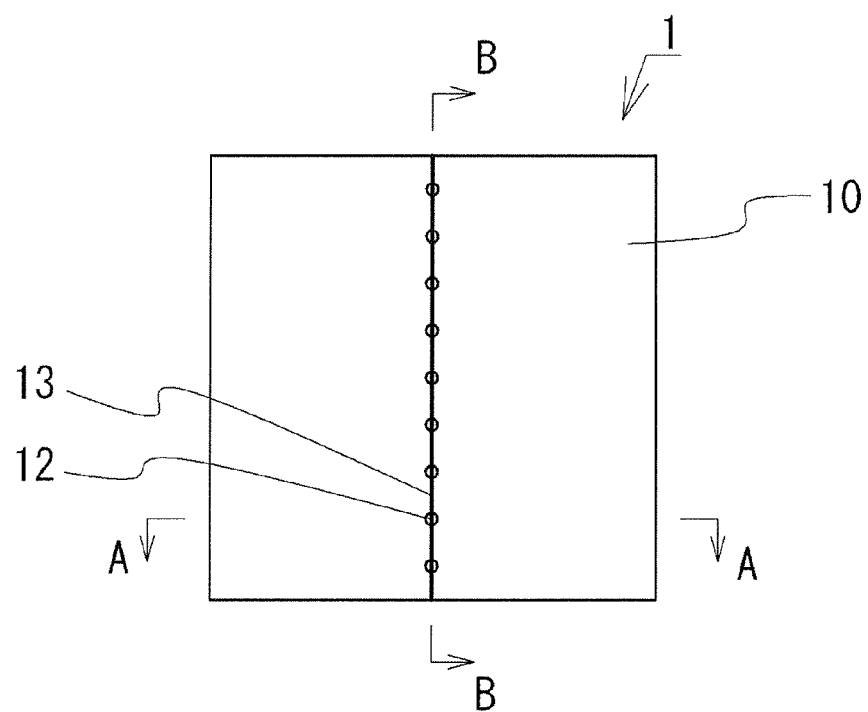
FIG. 2 is simplified plan view illustrating the main steps in this embodiment.

FIGS. 1 and 2 are simplified plan views illustrating part of the main steps entailed by the method for manufacturing a semiconductor element in this embodiment.

First, a wafer 1 that has a substrate 10 and is later divided into semiconductor elements is irradiated with a laser along the intended dividing line 11 shown in FIG. 1. As shown in FIG. 2, a plurality of processed portions 12 that are separated from one another can be formed by focusing a pulsed laser beam inside of the substrate 10. At the same time, a fissure 13 can be created that runs from the processed portions 12 at least to the surface of the substrate 10 and that links adjacent processed portions 12. Although not depicted in the drawings, a fissure is sometimes produced on the substrate surface that extends in a different direction from that of the fissure linking the processed portions. The wafer can be divided accurately by creating a fissure that links at least adjacent processed portions. It is preferable here if the fissure runs from all of the processed portions 12 to the surface of the substrate 10, but the fissure runs from at least a plurality of processed portions to the surface of the substrate. It is preferable to create a fissure that will link all of the adjacent processed portions, but the fissure at least links adjacent processed portions at a plurality of locations. Furthermore, it is preferable to create a fissure that runs to the surface of the substrate and a fissure that reaches to adjacent processed portions for a single processed portion, but a fissure that runs to the surface of the substrate and a fissure that links adjacent processed portions may be formed at different processed portions.

Figure 3:
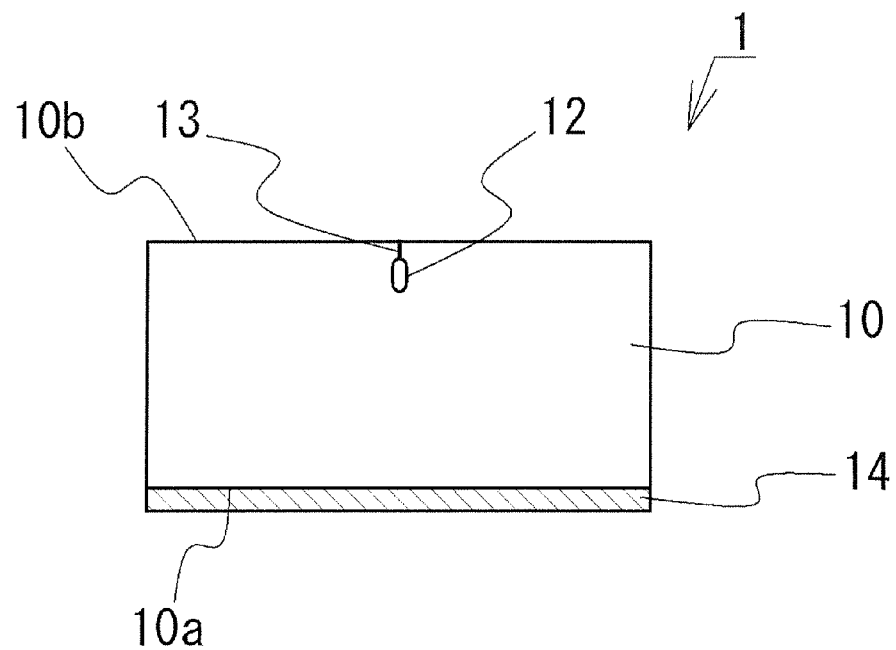
FIG. 3 is a sectional view along A-A in FIG. 2.

FIG. 2 shows the locations of the processed portions 12 for the sake of description, but the actual processed portions 12 are formed inside of the substrate 10 as shown in FIG. 3. FIG. 3 is a simplified cross section as viewed from the A-A line in FIG. 2. A semiconductor layer 14 is provided on a first main face 10a of the substrate 10. The processed portions 12 are formed inside of the substrate 10 by laser irradiation, and the fissure 13 is created from the processed portions 12 to a second main face 10b of the substrate. Such linking adjacent processed portions 12 with the fissure 13 results in a linear fissure 13 that runs long an intended dividing line being produced on the surface of the substrate 10, as shown in FIG. 2. The fissure is created from the processed portions. That is, the processed portions are formed near the focal positions by focusing a pulsed laser beam inside of the wafer, and it is believed that compression stress occurs around these locations, and that the fissure is created by this compression stress.

When the processed portions are thus formed, as will be discussed below, the processed portions and the fissure can be suitably formed by strictly controlling one or more of, and preferably all of, the following: the means for forming the processed portions (such as using a pulsed laser), the laser energy, frequency, or pulse width, the spot diameter or shape of the processed portions, and the positions of the processed portions inside of the substrate (such as the depth of the processed portions from the substrate or semiconductor layer, or the spacing between the processed portions).

The pulsed laser beam can be selected from those capable of processing inside of a substrate, and more specifically, the amount of energy per pulse is favorably 0.8 to 5 μJ, and preferably 0.8 to 2.5 μJ. The frequency is favorably 50 to 200 kHz, and preferably 50 to 100 kHz. The pulse width is favorably selected from a range over which working by multiphoton absorption is possible, in order to form processed portions with which there will be no optical absorption due to discoloration. An example is a range of 300 to 50,000 fs. Setting the pulse width to within this range prevents discoloration caused by resolidification after the melting of the processed portions. This is particularly effective when the semiconductor elements obtained after dividing are light emitting elements.

The focal position of the laser beam is favorably selected from a region in which the processed portions do not reach the substrate surface, and the depth from the substrate surface is preferably at least half the working spot diameter. A depth of 5 μm or more is preferable when taking into account error of the laser apparatus or irregularity of the substrate surface. In the case of a wafer having a semiconductor layer on the opposite side from the substrate surface (hereinafter sometimes referred to as the "back side"), typically there is a risk of damage to the semiconductor layer if the distance between the focal position and the semiconductor layer is 30 μm or less, so the distance from the semiconductor layer is preferably greater than 30 μm. The distance from the substrate surface in this case is favorably 50 μm or less, with 25 μm or less being preferable, and 10 μm or less even better.

The distance between the processed portions on the substrate surface produced by the laser beam directed along the intended dividing line typically is substantially constant, and is selected from a range that will produce a fissure at least linking the processed portions on the substrate surface. More specifically, the distance between the processed portions is preferably one to four times the working spot diameter. It is preferable here if the fissure is produced between all of the processed portions 12, but the fissure should be produced between at least a plurality of the processed portions. If the distance between the processed portions is too short, it is believed that compression stress will be produced by the next laser irradiation in the region where compression stress was produced by the previous laser irradiation, the stresses in this region will cancel each other out, and the processed portions will not be linked by a fissure. Accordingly, to link the processed portions with a fissure inside of the substrate as well, the distance between the processed portions is favorably set to be at least the working spot diameter on a plane parallel to the substrate main face, and is preferably one to four times the working spot diameter, and more preferably 1.5 to 3 times. It is believed that if the compression stress reaches deep into inside of the substrate, the division will tend to be along the intended dividing line substantially perpendicular to the substrate surface, so it is preferable to create compression stress between processed portions inside of the substrate as well, as discussed above. Also, a wafer can be accurately divided in just a single stage of working, as shown in FIG. 3, by thus having this compression stress go deep into the substrate.

The spot diameter (φμm) of the laser beam can be calculated from the following equation. λ is the wavelength (μm) of the laser beam, D is the laser beam emitted spot diameter (φμm), and f is the focal distance (μm) of an objective lens. Preferably, the positions of the processed portions are adjusted by factoring in the effect of deviation from the theoretical spot diameter due to the actual working situation. More specifically, the diameter of the processed portions formed in the substrate is preferably adjusted as the working spot diameter.

$$\text{Spot diameter } (\phi\mu m) = (4 \cdot \lambda \cdot f) / \pi \cdot D$$

The pulsed laser beam is preferably emitted from the substrate main face side on which the fissure linking the processed portions is to run. This is because stress tends to accumulate on the laser beam irradiation side, and it is easier to generate a fissure that extends from the processed portions to the substrate surface. Typically, the laser is emitted from the substrate main face side closer to the focal position of the laser beam, that is, closer to the positions where the processed portions will be formed. For example, when the fissure is made to run to the second main face 10b as with the wafer 1 shown in FIG. 3, preferably the laser beam is emitted from the second main face 10b, so that the processed portions 12 are formed toward the second main face 10b.

Figure 4:
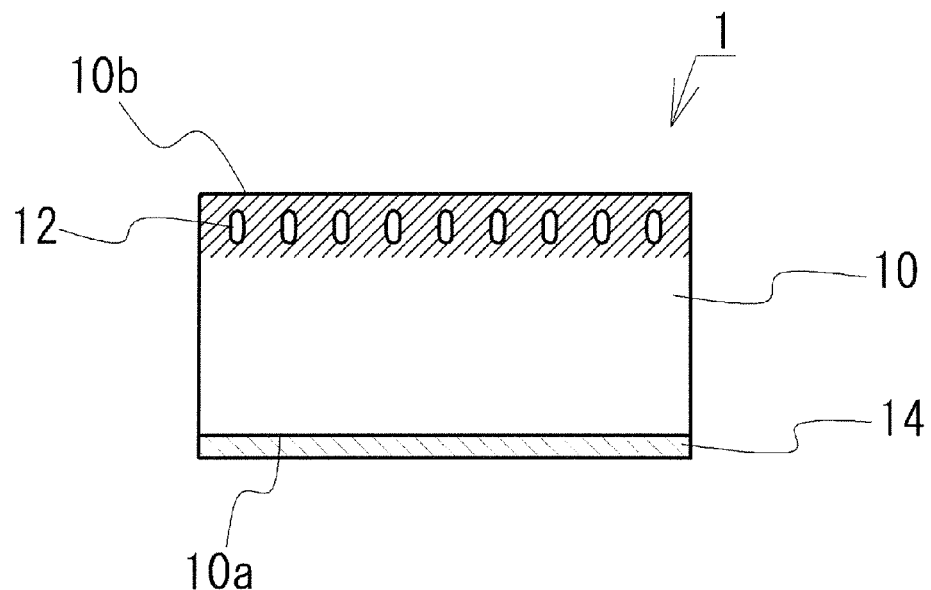
FIG. 4 is a sectional view along B-B in FIG. 2.

FIG. 4 is a simplified cross section as viewed from the B-B line in FIG. 2. The processed portions 12 have a shape that is longer in the direction of laser irradiation, and when the laser irradiation is performed from directly over the substrate, the shape is longer in the depth direction of the substrate, as shown in FIG. 4. The fissure is created in the range of the hatching going upward to the right in FIG. 4, for example. The fissure generated in this hatched area extends from the processed portions 12 to the second main face 10b, and at least links the processed portions 12 on the substrate surface. Usually, the processed portions extend to the substrate surface side from the focal position of the laser beam, so the distance from the processed portions to the substrate surface is less than the distance from the focal position of the laser beam to the substrate surface.

The fissure is generated around the processed portions, and preferably links adjacent processed portions inside of the substrate as well. It is surmised that thus forming the fissure down deep results in the compression stress produced by laser irradiation being generated down deep. Consequently, it is believed that the substrate tends to be divided along the laser irradiation direction. If the processed portions are linked by a fissure inside of the substrate, it is believed that the fissure can be made to run from the processed portions to the substrate surface by setting the distance from the processed portions to the substrate surface to be no more than the distance between the processed portions, and preferably to no more than half the distance between the processed portions.

Figure 5:
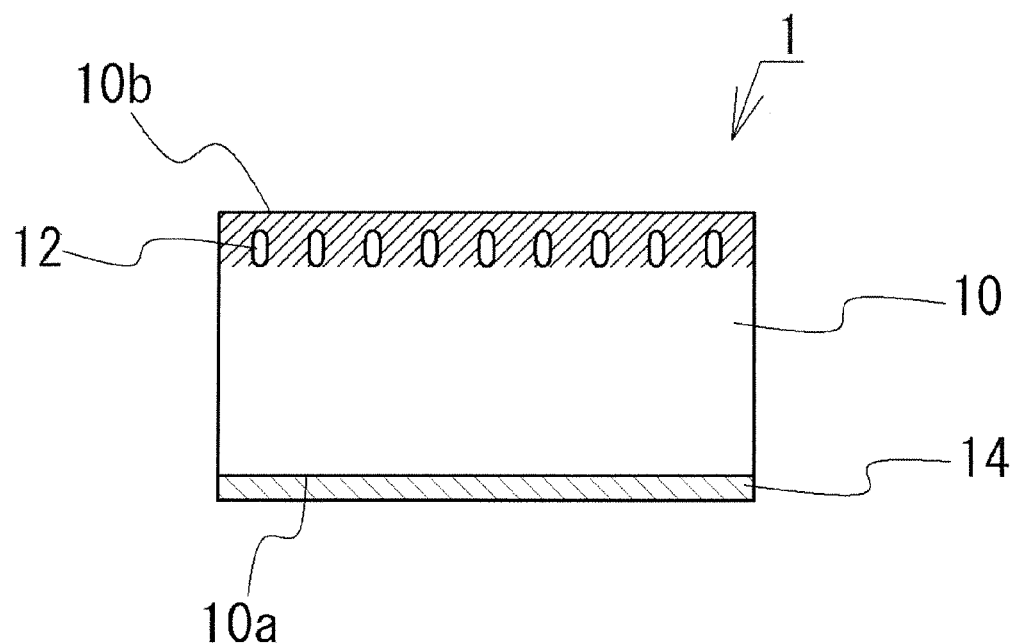
FIG. 5 is a sectional view describing a step of an embodiment.

The depth of the fissure can be adjusted by controlling the compression stress imparted by laser irradiation. For example, as shown in FIG. 5, the fissure can be formed more shallowly than in FIG. 4. This depth of the fissure can be adjusted by controlling one or more of the irradiating laser wavelength, frequency pulse waveform, pulse width, focal precision, working feed rate, and position or shape of the processed portions. In addition, examples of methods for imparting compression stress to the substrate include one in which the substrate is ground and polished prior to laser irradiation, and one in which the face of the substrate on the laser irradiation side is held so that it will become concave during laser irradiation. It is believed that the fissure can be formed more deeply by expanding the compression stress width range.

Wafer Division Step

Figure 6:
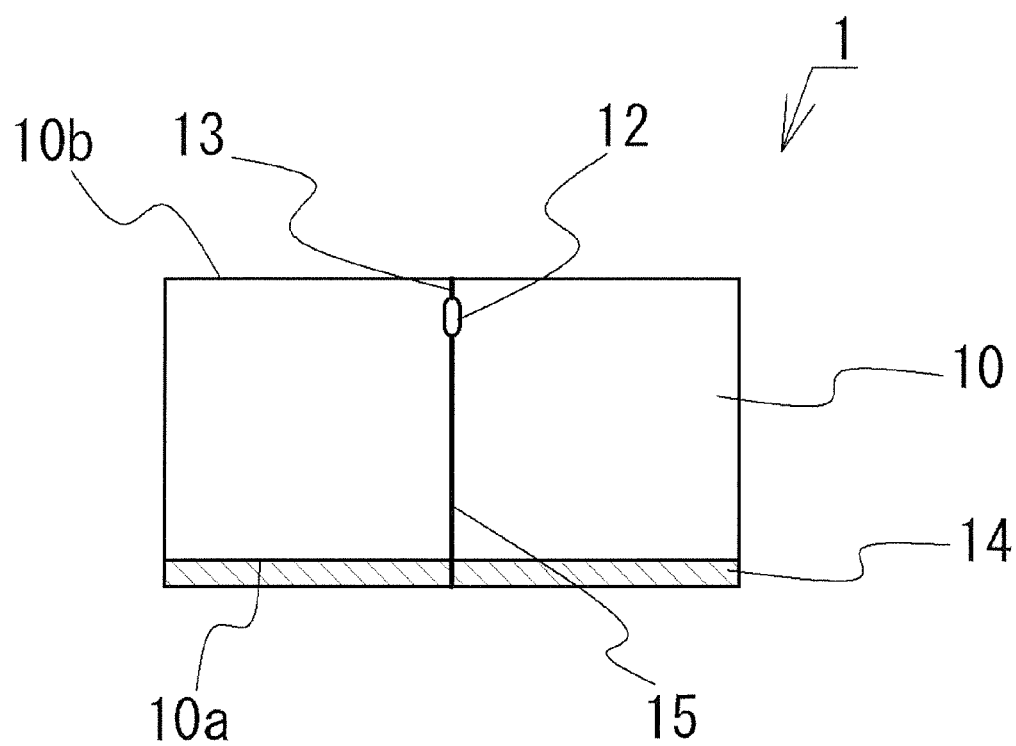
FIG. 6 is simplified sectional view illustrating the main steps in this embodiment.

As shown in FIG. 6, a crack 15 is made to run from the processed portions 12 or the fissure 13 to the first main face 10a side, and the wafer is divided along an intended dividing line. This division can be accomplished by a known method, such as pressing a breaking knife against the wafer along the intended dividing line and then applying enough force to split the wafer.

FIG. 6 is a simplified cross section as viewed from the same direction as in FIG. 3, and illustrates part of the main steps in the method for manufacturing a semiconductor element of this embodiment. The fissure 13 links adjacent processed portions 12 as discussed above, that is, the fissure 13 links them linearly along the intended dividing line on the second main face 10b of the substrate 10. Consequently, the crack 15 can be made to run along the intended dividing line in the same manner as the fissure 13, and the wafer 1 can be divided accurately along the intended dividing line. Here, the wafer is preferably divided along at least part of the fissure, and it is not necessary for the face obtained by division to conform perfectly to the fissure. Some of the fissure may remain inside of or on the surface of the substrate after division.

Some trace of the processed portions and fissure can usually be discerned on the side faces of the semiconductor elements obtained by dividing the wafer. More specifically, as shown in FIGS. 4 and 5 discussed above, the processed portions 12, which do not extend to the substrate surface, typically are spaced apart at substantially constant intervals, and irregularity produced by the fissure remains from the processed portions 12 all the way to the substrate surface. This irregularity can be seen as the hatching that goes upward to the right in FIGS. 4 and 5. The processed portions and irregularity is seen over a range of about 5 to 30 μm from the substrate surface, for example, on the side faces obtained by division.

FIG. 7 is a schematic diagram of the part of the face obtained by division that is close to the second main face 10b. The processed portions 12 provided away from the second main face 10b of the substrate 10 have top parts 12a and bottom parts 12b, and the face of fine irregularity 16, which is surmised to be produced by the fissure, links the top parts 12a and bottom parts 12b of adjacent processed portions 12. The processed portions 12 are apart from the second main face 10b of the substrate 10, and the distance between the second main face 10b and the processed portions 12 can be set to about 1 μm or more. More specifically, this distance is about 1 to 15 μm. The length of the processed portions 12 can be set to about 5 to 30 μm. The length of the top parts 12a can be set to about 3 to 10 μm. The irregularity 16 decreases moving away from the second main face, and tends to be almost invisible far away from the bottom parts. The height difference of the irregularity 16 is a few microns or less, such as 2 μm or less. When the side face is observed after division, the bottom parts of the processed portions are hard to tell apart from irregularity caused by the fissure, but the irregularity region extending continuously from the top part to the first main face side in substantially linear fashion can be considered to be the bottom part. Also, when processed portions are formed by the multiphoton absorption of a laser beam, the top parts of the processed portions can be recognized as particularly smooth faces.

As shown in FIG. 7, when the processed portions have top parts and bottom parts, the fissure preferably links at least adjacent top parts, and more preferably also links adjacent bottom parts. The closer to the distal end side of the bottom part on the opposite side from the top part, the more difficult linking by the fissure tends to be. A processed portion component in which the top part is present on the second main face side can be formed by irradiating with a laser beam from the second main face side, for example. The size of the processed portions and the irregularity can be varied according to the thickness of the substrate, and the numerical ranges given above are particularly favorable when dividing a substrate with a thickness of about 50 to 150 μm. The range over which the processed portions and irregularity are formed is favorably at least approximately 10% of the thickness of the substrate, with approximately 80% or less being preferable, and approximately 40% or less being even better. The use of this range allows the substrate to be divided efficiently and prevents damage to the semiconductor layer.

Wafer

The term "wafer" usually means a flat base that is grown in from a raw material substance in a columnar shape called an ingot, and then sliced thinly. In this application, just this flat base may be the "substrate" referred to below, or it may be made into a wafer in a state in which a semiconductor layer, a dielectric layer, an insulator layer, a conductor layer, or the like are laminated in one or more layers on this substrate.

Substrate 10

The material of the substrate can be selected from among those that can be processed with a pulsed laser beam. More specifically, sapphire, silicon, SiC, GaAs, GaN, AlN, and the like can be used. Typically, a material on which a semiconductor layer can be grown is selected for the substrate. With a sapphire substrate, the division plane tends not to be along the crystal orientation, and when an external force is exerted to split the substrate, it may be divided in a different direction from the intended dividing line, so division accuracy can be improved by using the method of this embodiment. There are no particular restrictions on the thickness of the substrate, but it may be 50 to 150 μm, for example. Forming processed portions by the method of this embodiment in a substrate with a thickness such as this allows the wafer to be divided without the need for performing laser working a plurality of levels of modification.

As shown in FIG. 8, depending on the material of the substrate and the direction of the intended dividing line, the fissure 13 that links the processed portions 12 may undulate. That is, the fissure 13 may go roundaboutly the adjacent processed portions 12. The angle of the fissure to a straight line connecting adjacent processed portions tends to be a function of the crystal system of the substrate material, or more specifically, can be selected from a range of about 10 to 70 degrees. With an intended dividing line or substrate material with which such a fissure is readily produced, it is believed that reducing the distance between the processed portions makes the fissure closer to a straight line connecting the shortest distance between processed portions, but from the standpoint of energy efficiency, it is preferable to use a fissure 13 that go around as shown in FIG. 8. Since this fissure links the processed portions, even if it should deviate from a straight line connecting the processed portions, the distance of this deviation is only about 0.5 to 10 μm at most, and creating a fissure such as this allows the wafer to be divided at a plane substantially perpendicular to the substrate main face. For example, with a sapphire substrate having a hexagonal system, the substrate surface through which the fissure runs is a plane other than the A plane, and when the intended dividing line is a line that intersects the a axis of the substrate, the resulting fissure tends to detour between the processed portions. This tendency is particularly pronounced when using a sapphire substrate whose main plane is the C plane. The "sapphire substrate whose main plane is the C plane" mentioned here may be one in which the main plane is a plane that is inclined by a few degrees from the C plane.

A light emitting element is usually substantially square or substantially rectangular, and two kinds of line that intersect substantially at a right angle are set as the intended dividing lines. In the case of a sapphire substrate or other such substrate with a hexagonal system, if one intended dividing line is set in a direction of relatively easy division, another intended dividing line that is substantially perpendicular to it is set in a direction of difficult division.

For example, as shown in FIG. 9, if first processed portions 22a along a first intended dividing line and second processed portions 22b along a second intended dividing line are formed inside of a wafer 2, a second fissure 23b that links the second processed portions 22b runs substantially linearly along the second division line, whereas a first fissure 23a that links the first processed portions 22a runs roundaboutly the first processed portions 22a. When a sapphire substrate whose main plane is the C plane is used as the substrate, if the first intended dividing line is a line substantially parallel to the m axis of the substrate, and the second intended dividing line is a line substantially parallel to the a axis of the substrate, the second fissure will tend to run in a substantially linear shape, which is preferable.

If the first fissure undulates and the second fissure runs substantially linearly, it is believed that the direction of the second intended dividing line affords easier division than the direction of the first intended dividing line, so as shown in FIG. 10, the wafer can be efficiently divided by having the distance between the second processed portions 22b greater than the distance between the first processed portions 22a inside of the substrate 20.

The method of this embodiment can be used only in the division of the first intended dividing line, and a division at the second intended dividing line can be made with a cutter scribe, for example.

Furthermore, with the method of this embodiment, it does not matter whether the first fissure or the second fissure, that is, the first intended dividing line or the second intended dividing line, is formed first.

Semiconductor Layer 14

A semiconductor layer composed of any of various semiconductor materials can be selected as the semiconductor layer, an example of which is a gallium nitride compound semiconductor layer. More specifically, an example is a compound expressed by $In_xAl_yGa_{1-x-y}N$ ($0 \le x \le 1$, $0 \le y \le 1$, $0 \le x+y \le 1$). The semiconductor layer is usually produced by laminating a first conductive layer, a light emitting layer, and a second conductive layer in that order (starting from the substrate side) over a sapphire substrate, and may contain one or more n-type impurities such as silicon, germanium, tin, sulfur, oxygen, titanium, zirconium, cadmium, or other such group IV elements, group VI elements, or the like, or may contain a p-type impurity such as magnesium, zinc, beryllium, manganese, calcium, or strontium, as a first or second conductivity type of impurity.

There are no particular restrictions on the method for growing the semiconductor layer, and any method known as a semiconductor growth method can be used favorably, such as MOVPE (metal organic vapor phase epitaxy), MOCVD (metal organic chemical vapor deposition), HVPE (hydride vapor phase epitaxy), or MBE (molecular beam epitaxy). MOCVD is particularly favorable because it grows the material with good crystallinity.

Since the semiconductor layer is usually thinner than the substrate, if, as shown in the above-mentioned FIG. 6, the semiconductor layer 14 is formed on the first main face 10a of the substrate 10, and the processed portions 12 are formed on the second main face 10b side, then there is no need to remove the semiconductor layer 14 directly under the processed portions 12, and the semiconductor layer 14 can be divided at the same time by means of the crack 15 extending from the substrate 10. Irradiation with a laser beam from the second main face side is preferable in order to minimize damage to the semiconductor layer. Division can be similarly performed when forming the processed portions on the first main face side on which the semiconductor layer is provided.

As shown in FIG. 11, when processed portions 32 are formed inside of a substrate 30 on the first main face 30a side in a wafer 3 having the substrate 30 and a semiconductor layer 34 provided on the first main face 30a of the substrate 30, prior to laser irradiation a semiconductor layer 34 is removed along the intended dividing line from the region corresponding to the locations where the processed portions 32 will be formed, after which the processed portions 32 are formed and a fissure 33 is made to run up to the first main face 30a, which prevents damage to the semiconductor layer by laser irradiation. In this case, the irradiation with the laser beam is preferably performed from the first main face side.

Example 1

A wafer was prepared in which a GaN-based semiconductor layer was formed on one main face of a sapphire substrate with a thickness of approximately 85 μm. The semiconductor layer was produced by laminating an n-type semiconductor layer, a light emitting layer, and a p-type semiconductor layer in that order, starting from the sapphire substrate side, on the (0001) plane of the sapphire substrate.

After this, part of the light emitting layer and p-type semiconductor layer are removed to expose the n-type semiconductor layer, and an n electrode is formed on the n-type semiconductor layer surface, and a p electrode on the p-type semiconductor layer surface.

To obtain a substantially square element measuring approximately 250 μm on one side, the intended dividing lines of the wafer were set in two directions, one substantially parallel and one substantially perpendicular to the a axis of the sapphire substrate, and a pulsed laser beam was directed along each of the intended dividing lines from the other main face side of the sapphire substrate, using a near infrared laser with an output of approximately 0.2 W. The focal position of the laser beam was set to a depth of approximately 5 μm from the substrate surface, and the distance from a previous focal position to the next focal position was set to approximately 3.5 μm.

After laser irradiation, a light source was disposed on the semiconductor layer side, and observation was made with an optical microscope from the other main face side of the sapphire substrate, which confirmed substantially circular processed portions and a fissure extending from the processed portion, and also confirmed that at least part of the fissure ran so as to link the processed portions on the substrate surface. A comparison of the fissures linking the processed portions along the intended dividing lines in the two directions reveals that the fissure along the intended dividing line substantially perpendicular to the a axis undulates more than the fissure along the intended dividing line substantially parallel to the a axis.

Next, a breaking blade was pressed against the wafer along the intended dividing lines, force was exerted to split the wafer, and substantially square semiconductor elements measuring approximately 250 μm on one side were obtained. The elements thus obtained were observed, which confirmed that the side faces of the elements had been divided substantially perpendicular to the sapphire substrate surface, and that processed portions extending linearly in the depth direction of the substrate were near the substrate surface. No discoloration of the processed portions was seen, and it is surmised that they were formed by multiphoton absorption produced by laser irradiation. The distance from the processed portions to the substrate surface was about 1 to 10 μm, the maximum width of the processed portions was about 0.5 to 2 μm, and irregular bumpiness was confirmed from the processed portions to the substrate surface.

It is surmised that the irregularity was formed by the fissures, and the same irregularity was confirmed on the faces between processed portions. The processed portions and the irregularity surfaces were formed to a depth of about 15 to 20 µm from the substrate surface. Deeper surfaces, that is, those on the semiconductor layer side, were either flat or comprised a series of stepped flat surfaces, and were surmised to be surfaces divided after laser irradiation.

Example 2

In this example, semiconductor elements are manufactured in the same manner as in Example 1, except that the distance between the focal positions of the laser beam is set to approximately 5 µm in irradiation with the laser beam along an intended dividing line substantially parallel to the a axis.

After laser irradiation, the sapphire substrate surface is observed, which confirmed the presence of substantially circular processed portions and a fissure extending from the processed portions, and confirmed that at least part of the fissure ran so as to link the processed portions on the substrate surface. After wafer division the semiconductor elements thus obtained are observed, which revealed that the element side faces is divided substantially perpendicular to the sapphire substrate surface.

The manufacturing method of the illustrated embodiments can be applied to elements that are made into elements by the division of a wafer having a substrate. It can be applied to a semiconductor element in which a semiconductor layer is provided on a substrate, and can be applied to a light emitting element such as an LED or LD, a light emitting element that also includes a light receiving element, or a semiconductor element that includes a transistor, such as an HEMT or FET.

DESCRIPTION OF THE NUMERALS 1, 2, 3: wafer; 10, 20, 30: substrate; 10a, 30a: first main face; 10b, 30b: second main face; 11: intended dividing line; 12, 32: processed portion; 12a: top part; 12b: bottom part; 13, 33: fissure; 14, 34: semiconductor layer; 15: crack; 16: irregularity; 22a: first processed portion; 22b: second processed portion; 23a: first fissure; 23b: second fissure; 40, 50: substrate; 41: modification region; 51: modified component; 53: groove; and 42, 52: semiconductor layer.

The invention claimed is:

1. A method for manufacturing a semiconductor element, comprising:
   a laser irradiation step of focusing a pulsed laser beam inside of a sapphire substrate constituting a wafer, thereby forming a plurality of isolated processed portions inside of the substrate along an intended dividing line extending in a direction parallel to a main face of the substrate, and creating a fissure that runs from the processed portions at least to the main face of the substrate and links adjacent processed portions aligned along the direction parallel to the main face of the substrate; and
   a wafer division step of dividing the wafer along the intended dividing line after the laser irradiation step.

2. The method for manufacturing a semiconductor element according to claim 1, wherein the fissure links adjacent processed portions inside of the substrate.

3. The method for manufacturing a semiconductor element according to claim 2, wherein the processed portions have a top part and a bottom part, and the fissure links the top parts and bottom parts of adjacent processed portions.

4. The method for manufacturing a semiconductor element according to claim 1, wherein the distance between the focal position of the pulsed laser beam and the main face of the substrate is at least half a working spot diameter of the pulsed laser beam, and no more than 25 µm.

5. The method for manufacturing a semiconductor element according to claim 1, wherein the distance between the focal position of the pulsed laser beam and the main face of the substrate is at least 5 µm and no more than 25 µm.

6. The method for manufacturing a semiconductor element according to claim 1, wherein the distance between processed portions is at least the working spot diameter of the pulsed laser beam.

7. The method for manufacturing a semiconductor element according to claim 1, wherein the processed portions and the fissures are formed within a range of at least 10% and no more than 80% of the thickness of the substrate.

8. The method for manufacturing a semiconductor element according to claim 1,
   wherein the intended dividing line is a first intended dividing line, and the fissure is a first fissure,
   the laser irradiation step further involves focusing the pulsed laser beam inside of the substrate along a second intended dividing line that is substantially perpendicular to the first intended dividing line, thereby forming a plurality of isolated processed portions along an intended dividing line inside of the substrate, and creating a second fissure that runs from the processed portions at least to the main face of the substrate and links adjacent processed portions, and
   the wafer division step further involves dividing the wafer along the second intended dividing line.

9. The method for manufacturing a semiconductor element according to claim 8, wherein the first fissure goes roundaboutly adjacent processed portions, and the second fissure runs along the second intended dividing line.

10. The method for manufacturing a semiconductor element according to claim 8, wherein the spacing of the processed portions formed along the first intended dividing line is less than the spacing of the processed portions formed along the second intended dividing line.

11. The method for manufacturing a semiconductor element according to claim 1, wherein the substrate has a first main face and a second main face, a semiconductor layer is provided on the first main face, and the pulsed laser beam is emitted from the second main face side in the laser irradiation step.

12. The method for manufacturing a semiconductor element according to claim 11, wherein the second main face is a plane different from the A plane, and the intended dividing line is a line that intersects the a axis of the substrate.

13. The method for manufacturing a semiconductor element according to claim 11, wherein the distance between the focal position of the pulsed laser beam and the semiconductor layer is greater than 30 µm.

14. The method for manufacturing a semiconductor element according to claim 1, wherein the processed portions are produced by multiphoton absorption.

15. The method for manufacturing a semiconductor element according to claim 1, wherein the fissure at least links the processed portions on the main face of the substrate.

16. The method for manufacturing a semiconductor element according to claim 1, wherein the substrate has a first main face and a second main face, the fissure that runs at least to the main face of the substrate is formed on the first main face of the substrate, and
   the division of the wafer is performed by a crack that runs from at least one of the processed portions and the fissure to the second main face in the wafer division step.

17. The method for manufacturing a semiconductor element according to claim 1, wherein the pulse width of the pulsed laser beam is in a range of 300 to 50,000 fs.

\* \* \* \* \*